(12) United States Patent
Fujii

(10) Patent No.: US 6,903,375 B1
(45) Date of Patent: Jun. 7, 2005

(54) SOLID-STATE IMAGE DEVICE, CAMERA USING THE SAME, AND METHOD OF MANUFACTURING THE SAME

(75) Inventor: Eizou Fujii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1006 days.

(21) Appl. No.: 09/613,795

(22) Filed: Jul. 11, 2000

(30) Foreign Application Priority Data

Jul. 13, 1999 (JP) .............................. 11-199603

(51) Int. Cl.[7] .................. H01L 27/15; H01L 31/12; H01L 33/00; H01L 21/00
(52) U.S. Cl. ........................................ 257/81; 438/64
(58) Field of Search ............... 257/81; 438/64

(56) References Cited

U.S. PATENT DOCUMENTS

| | | | | |
|---|---|---|---|---|
| 5,223,746 A | * | 6/1993 | Abe et al. | 257/678 |
| 5,633,089 A | | 5/1997 | Kondo | |
| 5,977,567 A | * | 11/1999 | Verdiell | 257/99 |

FOREIGN PATENT DOCUMENTS

| | | |
|---|---|---|
| JP | 56-038467 | 8/1979 |
| JP | 61-66782 | 4/1986 |
| JP | 1-194234 | 8/1989 |
| JP | 2-79998 | 3/1990 |
| JP | 2-274590 | 11/1990 |
| JP | 5-69428 | 3/1993 |
| JP | 06-151623 | 5/1994 |
| JP | 8-67818 | 3/1996 |
| JP | 8-151588 | 6/1996 |
| JP | 8-264946 | 10/1996 |
| JP | 10-041492 | 2/1998 |

* cited by examiner

*Primary Examiner*—Craig A. Thompson
*Assistant Examiner*—Nema Berezny
(74) *Attorney, Agent, or Firm*—Merchant and Gould P.C.

(57) ABSTRACT

Through holes are preformed in a ceramic sheet to form recessed portions at corners or side ends of a package 2 used for a solid-state image device. The package is positioned by allowing projections 52, 53, and 54 of a positioning jig 51 to come into contact with end faces 5 and 6 in the recessed portions along their shapes. The accuracy in combining a solid-state image element and a lens block is improved by using a method of positioning a package in which burrs caused when the package is produced by dividing a ceramic baked product do not affect the accuracy.

4 Claims, 18 Drawing Sheets

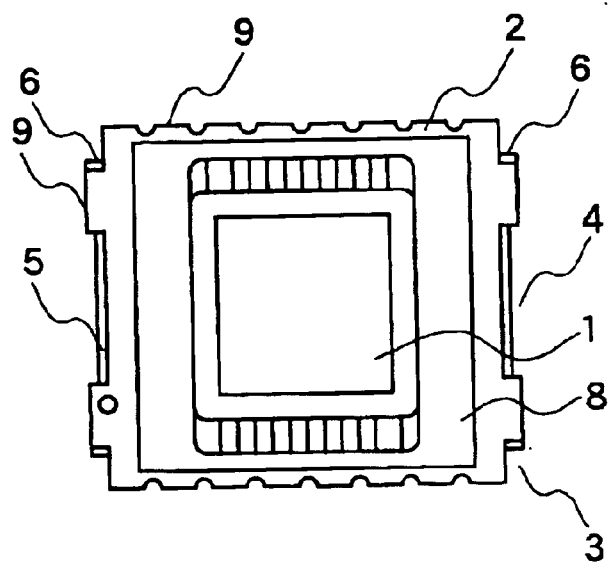
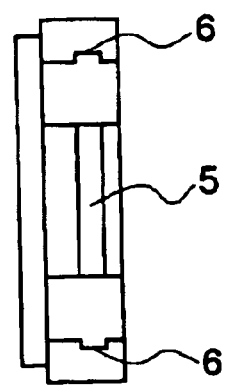
FIG. 5A
FIG. 5C
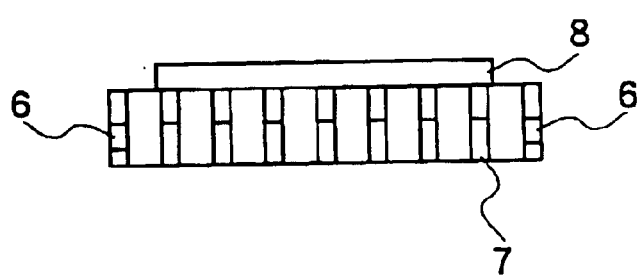
FIG. 5B

PRIOR ART

SOLID-STATE IMAGE DEVICE, CAMERA USING THE SAME, AND METHOD OF MANUFACTURING THE SAME

FIELD OF THE INVENTION

The present invention relates to a solid-state image device and a camera using the same and also-relates to a method of manufacturing the solid-state image device. Particularly, the present invention relates to the improvement in accuracy in positioning a solid-state image element and a lens block.

BACKGROUND OF THE INVENTION

A solid-state image element with a photoelectric conversion function is fixed to a package with a preformed wiring, which is used as a solid-state image device. Generally, the package is produced using a ceramic sheet. As an example, a method of producing a package using three ceramic sheets is described as follows.

As shown in FIGS. 13A, 13B, and 13C, predetermined through holes and printed circuits are preformed in ceramic sheets before baking (ceramic green sheets). In this example, holes are punched in a ceramic green sheet 111 to be the top layer and a ceramic green sheet 112 to be an intermediate layer, thus forming openings 114 and 115 for placing solid-state image elements. On the surface of the intermediate layer sheet 112, printed circuits 116 are formed. In these sheets 111 and 112 and a ceramic green sheet 113 positioned to be the bottom layer as a seating for the solid-state image elements, holes are punched to form through holes 117, 118, 119, 120, 121, and 122. These through holes having circular cross sections are positioned along virtual parting lines 124, 125, and 126 arranged in a reticulated form on the surfaces of the respective sheets. These through holes are formed for preventing corners from being broken (through holes 117, 119, and 121) or for providing outer leads to be connected to the printed circuits (through holes 118, 120, and 122).

As a next step, the three ceramic sheets are laminated with the parting lines of the respective sheets coinciding with respect to the lamination direction. As shown in FIG. 14, in this laminate 130, cuts 127 in the form of broken lines are provided along the parting lines in order to facilitate the dividing of the laminate carried out later. This laminate is baked and then is divided along the parting lines (breaking). The individual pieces thus produced are used as packages receiving solid-state image elements.

In a camera using a solid-state image device, it is important for securing optical characteristics to position a lens block and a solid-state image element at predetermined locations and then to fix them. The reason is that when an optical axis of a lens and a (design) optical axis of the solid-state image element do not coincide with each other, the characteristics deteriorate due to shading caused by unevenness in sensitivity or the like. Usually, the lens block is positioned with reference to a package of the solid-state image device. Therefore, accurate positioning of the package is required in both the cases of mounting the solid-state image element and positioning the lens block.

Conventionally, the positioning of the package has been carried out by, for example, the method illustrated in FIG. 16. In this method, a package 102 is positioned by being pressed against an L-shaped positioning jig 151. In this case, the package 102 is positioned with reference to the whole side ends 103 and 104 adjacent to each other via a corner. In this state, a solid-state image element 101 is fixed. Further, the package also is positioned by being pressed against a lens block with an L-shaped fixing portion similar to the above-mentioned positioning jig, and then the solid-state image device and the lens block are positioned with respect to each other.

JP 10-326886 A discloses a solid-state image device with a package 132 in which a substantially V-shaped pilot portion 135 and a substantially U-shaped guide portion 136 are formed as positioning notches as shown in FIGS. 17A and 17B. As shown in FIG. 18, a positioning pilot pin 137 and a positioning guide pin 138 are inserted into the pilot portion 135 and the guide portion 136 respectively, and the pilot portion 135 is pressed against the pilot pin 137 while the guide pin 138 is guided by the guide portion 136, thus positioning the solid-state image device. The guide pin 138 prevents the solid-state image device from rotating.

As described above, packages for solid-state image devices are produced by dividing a ceramic baked product. Therefore, it is difficult to cut and divide the ceramic baked product accurately along parting lines, and as shown in FIG. 15, a so-called "burr" 128 may be produced at a side end of a package in some cases. The projection of the "burr" at the side end has been a factor causing the deterioration in accuracy in the positioning of a package using the positioning jig as shown in FIG. 16.

In the positioning method using the positioning pins as shown in FIG. 18, the projection at the side end of the package does not affect the positioning accuracy. However, since it is required to form notches 135 and 136 for inserting positioning pins at a pair of opposed side ends, the size of the package cannot be reduced. In addition, because of a clearance in the guide portion 136 required for inserting the guide pin, the rotation cannot be prevented by the guide pin sufficiently.

SUMMARY OF THE INVENTION

The present invention is intended to provide solid-state image devices using a package that can be positioned accurately even when being reduced in size. The present invention also intended to provide a camera using a solid-state image device in which a solid-state image element and a lens block are positioned accurately. Furthermore, the present invention is intended to provide methods of manufacturing the solid-state image devices.

In order-to-achieve the above-mentioned objects, a first solid-state image device of the present invention includes a package with at least one corner having a recessed portion. The recessed portion is defined by an end face including at least two linear portions observed when being seen from the upper surface side of the package.

A second solid-state image device of the present invention includes a package having at least two recessed portions that are formed at least at one selected from two adjacent side ends of the package. The at least two recessed portions are defined by an end face including linear portions observed when being seen from the upper surface side of the package.

These solid-state image devices can be positioned accurately even when their sizes are reduced. In the present specification, the upper surface of a package denotes the surface to which a solid-state image element is fixed.

In the second solid-state image device, it is preferable that the linear portions are substantially parallel to either of two adjacent side ends, respectively.

It also is preferable that each of the packages mentioned above includes a member for patterning, on the surface of which a conductor pattern for transmitting signals from a solid-state image element is formed, and a frame member that has an opening surrounding the solid-state image element and is positioned above the member for patterning, and the linear portions, in the recessed portion or recessed portions, observed when being seen from the upper surface side of the package are formed of the member for patterning. The above-mentioned both members may be combined to form one body by baking or the like.

A first method of manufacturing a solid-state image device according to the present invention includes: forming at least two through holes in a ceramic green sheet; baking the ceramic green sheet to obtain a ceramic baked product; and dividing the ceramic baked product so that in a package, at least two recessed portions are formed from the at least two through holes, thus obtaining the package. The at least two through holes are positioned so that the recessed portions are formed at least at one selected from two adjacent side ends of the package. The at least two through holes are formed to have shapes surrounded by end faces including linear portions observed when being seen from the upper surface side of the package, thus forming linear portions on the end faces defining the at least two recessed portions.

In the first manufacturing method, a plurality of packages with substantially the same shape may be obtained by dividing the ceramic baked product. The first manufacturing method further may include a step of forming a laminate formed of at least two ceramic green sheets in which through holes are preformed.

A second method of manufacturing a solid-state image device of the present invention includes: preparing at least two ceramic green sheets and forming, in the sheets, through holes with substantially rectangular shapes on virtual parting lines arranged in a reticulated form on the sheets observed when being seen from the upper surface side of the sheets, with vertices of the substantially rectangular shapes not positioned on the virtual parting lines; laminating the ceramic green sheets with the virtual parting lines substantially coinciding in their lamination direction to form a laminate; baking the laminate to obtain a ceramic baked product; dividing the ceramic baked product along the virtual parting lines to obtain a plurality of packages having recessed portions formed from the through holes.

In the second manufacturing method, it is preferable that the through holes with substantially rectangular shapes are formed at intersections of the virtual parting lines with vertices of the substantially rectangular shapes not positioned on the virtual parting lines.

A third method of manufacturing a solid-state image device according to the present invention is characterized in that a package with first and second end faces formed by removing a portion at least at one selected from two adjacent side ends is positioned, using a positioning jig provided with first and second projections coming into contact with the first and second end faces along their shapes respectively, with the first and second projections being brought into contact with the first and second end faces along their shapes respectively, and in this state, a solid-state image element is fixed to the package. In this case, it is preferable that when the package is seen from its upper surface side, the contact faces between the first and second end faces and the first and second projections are formed substantially in at least one selected from a linear shape and an arc shape.

The first and second end faces may be formed in a single recessed portion or in at least two recessed portions at least at one of adjacent side ends.

A camera using the first solid-state image device of the present invention includes either of the above mentioned solid-state image devices of the present invention and a lens block. The lens block includes projections coming into contact with the linear portions respectively, which are observed when the solid-state image device is seen from the upper surface side, in the recessed portion or recessed portions along their shapes, and a lens focusing external light onto a solid-state image element included in the solid-state image device. The solid-state image device and the lens block are positioned with the projections being in contact with the linear portions along their shapes, respectively.

BRIEF DESCRIPTION OF THE DRAWINGS

FIGS. 1A, 1B, and 1C show plan views of sheets for explaining an example of processing ceramic sheets used for a solid-state image device of the present invention, wherein FIG. 1A shows a top sheet, FIG. 1B shows a second sheet, and FIG. 1C shows a bottom sheet.

FIG. 5A is a plan view of an embodiment of a solid-state image device according to the present invention; FIG. 5B is a front view of the same; and FIG. 5C is a side view of the same.

FIGS. 13A, 13B, and 13C show plan views of sheets for explaining an example of processing ceramic sheets used for a conventional solid-state image device, wherein FIG. 13A shows a top sheet, FIG. 13B shows a second sheet, and FIG. 13C shows a bottom sheet.

DETAILED DESCRIPTION OF THE INVENTION

Preferable embodiments of the present invention are described with reference to the drawings as follows.

Figure 1:
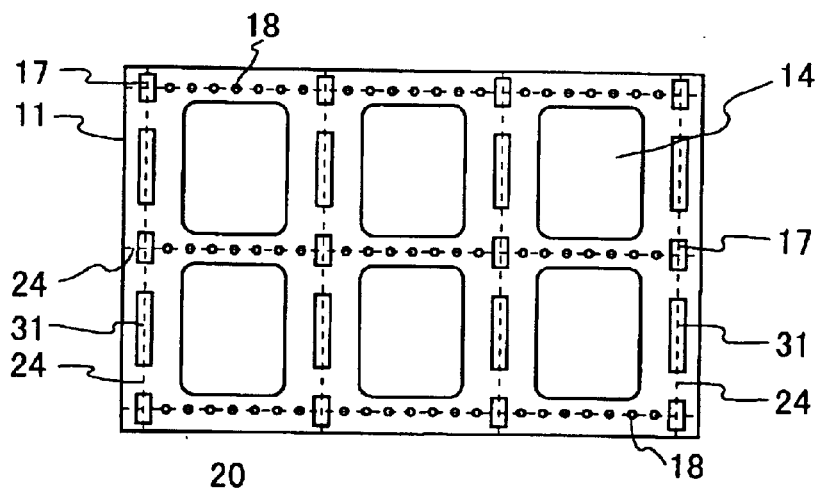
Figure 1:
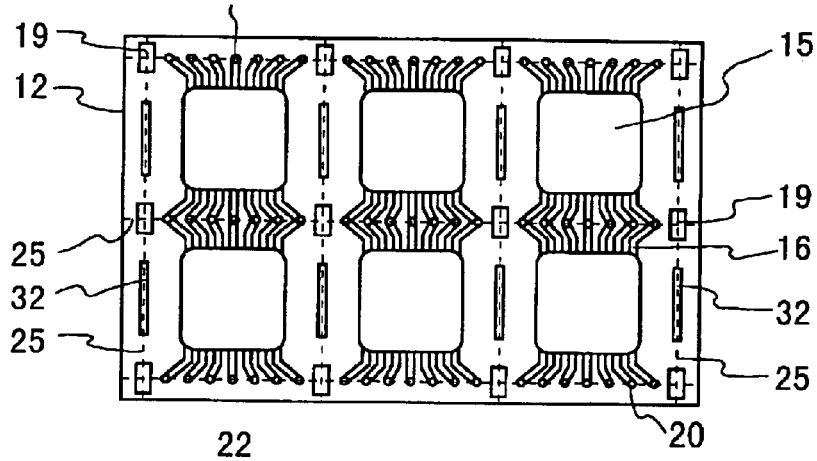
Figure 1:
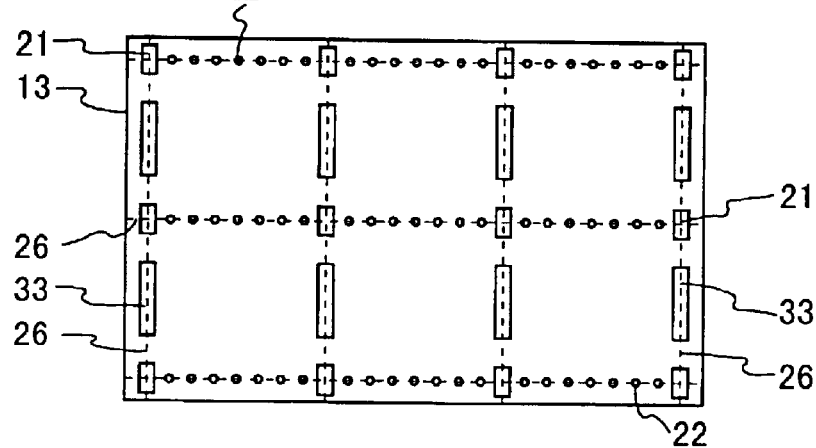

With reference to FIGS. 1A, 1B, and 1C, an embodiment of the method of manufacturing a solid-state image device of the present invention is described. The following description is directed to a method of producing a package from a laminate formed of three ceramic sheets. Initially, predetermined through holes are formed in three ceramic green sheets 11, 12, and 13 respectively and printed circuits also are formed.

In the first ceramic green sheet 11 to be the top layer and the second ceramic green sheet 12 to be an intermediate layer, openings 14 and 15 are punched for positioning solid-state image elements inside the openings, respectively. The openings 15 in the second sheet 12 are formed so as to have substantially the same shape after baking as the external shape of solid-state image elements to be used (i.e. so as to have a slightly larger shape than the external shape of the elements to allow for clearances to be produced when the elements are fixed). On the other hand, the openings 14 formed in the first sheet 11 are formed to be slightly larger than the openings 15 so that conductor patterns 16 formed on the surface of the second sheet are exposed.

In the first and second sheets 11 and 12 and the third ceramic green sheet 13 to be the bottom layer, through holes are formed along parting lines 24, 25, and 26 arranged in a reticulated form in the respective sheets so as to have predetermined shapes and patterns. The parting lines 24, 25, and 26 are illustrated for convenience in explanation, but indicate virtual patterns, which do not appear actually.

Through holes 18, 20, and 22 for forming outer leads in packages may have circular cross sections as in a conventional package. These through holes 18, 20, and 22 are formed to be aligned in one direction (in a horizontal direction in the figure) on the virtual lines.

At intersections in the reticulated parting lines 24, 25, and 26, through holes 17, 19, and 21 having rectangular shapes are formed. The through holes 17, 19, and 21 are positioned with the parting lines passing through middle points of long and short sides of the rectangular shapes. In addition, through holes 31, 32, and 33 with rectangular shapes also are formed on the parting lines between the intersections. The through holes 31, 32, and 33 are aligned in one direction (in a vertical direction in the figure) on the virtual lines with the parting lines passing through middle points of opposed sides. The above-mentioned through holes are formed by being punched in the sheets using molds with predetermined shapes.

The respective through holes 17, 19, 21, 31, 32, and 33 may not necessarily have the same size even when being formed in positions corresponding to one another. A preferable relationship in the size of the respective holes is described later.

Figure 14:
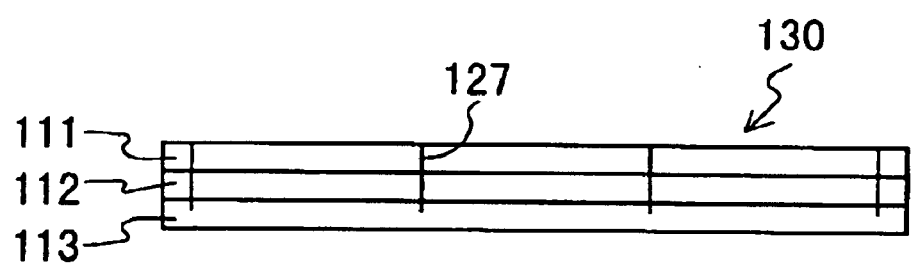
FIG. 14 is a sectional view of a ceramic laminate used for the conventional solid-state image device.
Figure 15:
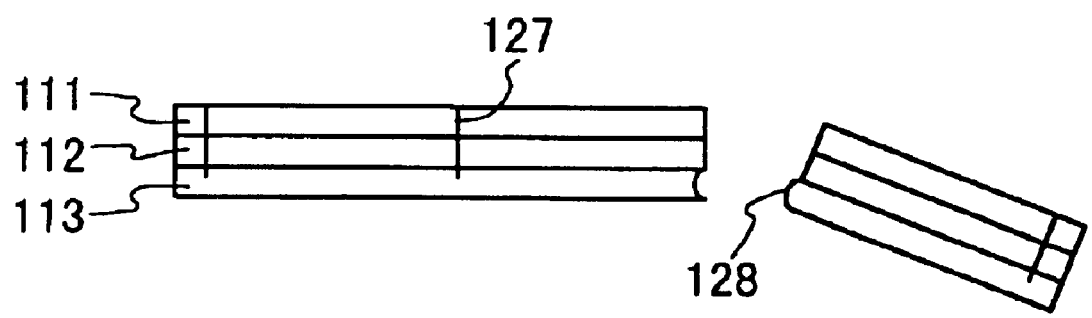
FIG. 15 is a sectional view for explaining the occurrence of a so-called "burr" produced when the ceramic laminate shown in FIG. 14 is divided.
Figure 16:
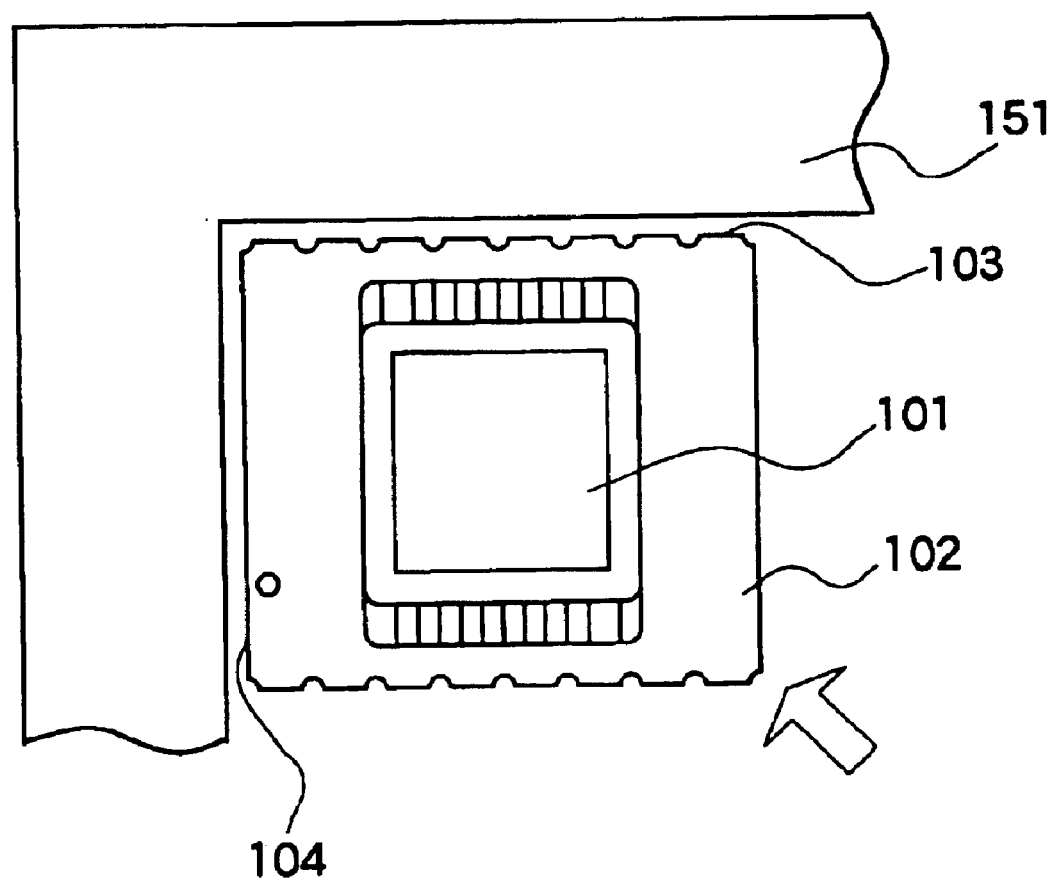
FIG. 16 is a plan view showing an example of a conventional method of positioning a package.

After completion of predetermined steps of, for example, forming printed circuits 16 by printing a conductive paste on the surface of the second sheet 12, the first to third sheets 11, 12, and 13 are laminated with the parting lines 24, 25, and 26 of the respective sheets coinciding in the lamination direction. A laminate thus obtained is provided with cuts along the parting lines and then is baked as described in the above with reference to FIG. 14. The ceramic laminate thus baked is divided into individual pieces along the respective parting lines utilizing the cuts, thus producing a plurality of ceramic packages having the same shape.

The above description was directed to the method of producing packages using three ceramic green sheets. However, the present invention is not limited to this and also can be applied to production of packages using two or less or four or more sheets.

In the above, the first ceramic green sheet 11 serves as a frame member surrounding solid-state image elements, the second ceramic green sheet 12 as a member for patterning on which conductor patterns are formed for transmitting light-receiving signals from the solid-state image elements to the outside, and the third ceramic green sheet 13 as a base member providing the surfaces to which the solid-state image elements are fixed. When packages are produced using, for example, two sheets, however, solid-state image elements may be fixed to the members for patterning, thus allowing the members for patterning to also serve as the base members. Furthermore, when packages are produced using only one sheet, a ceramic sheet serving as both the member for patterning and the base member may be produced and a resin frame with a smaller external shape than that of the ceramic sheet may be fixed to the surface of the ceramic sheet to serve as the frame members.

Figure 2A:
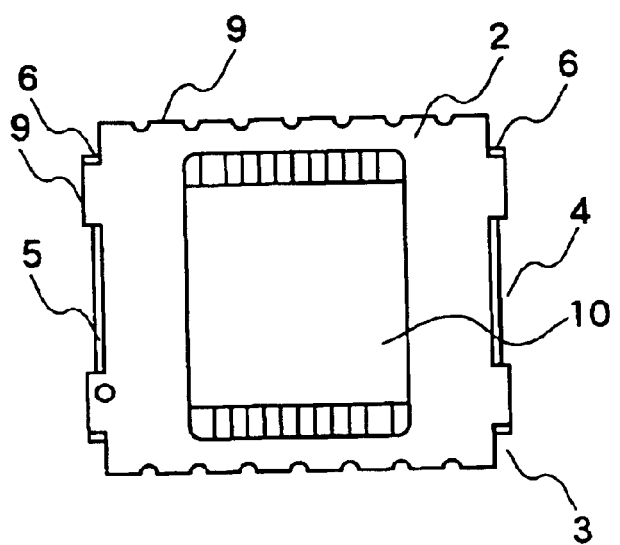
FIG. 2A is a plan view of an embodiment of a package used for a solid-state image device of the present invention.
Figure 2C:
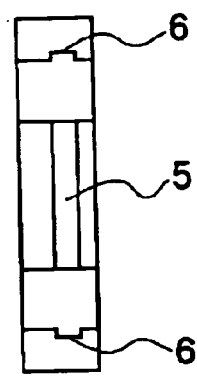
FIG. 2C is a side view of the same.
Figure 2B:
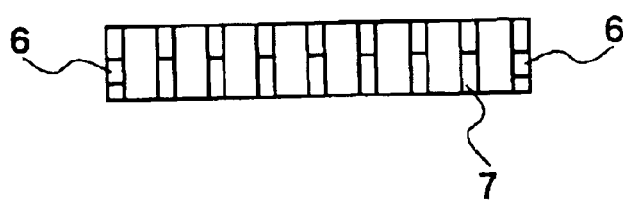
FIG. 2B is a front view of the same.

FIGS. 2A, 2B, and 2C show an embodiment of packages produced by the same method as in the above. A package 2 has a substantially rectangular outer shape when being seen from the upper surface side (FIG. 2A) and a concave portion 10 for placing a solid-state image element in the center of the upper surface. At each corner, a notch (a recessed portion) 3 is formed, which has a "L" shape when being seen from the upper surface side of the package. In addition, a notch (a recessed portion) 4 having a "U" shape when being seen from the upper surface side of the package also is formed at each side end at which no outer lead is formed (herein after referred to as a "short side end"; on the other hand, each side end at which outer leads are formed is referred to as a "long side end"). As described above, it is preferable that the notches formed at the side ends of the package have substantially "L" or "U" shapes when being seen from the upper surface side of the package.

The end faces in the notches 3 and 4 were produced when the through holes were formed in the ceramic green sheets and not when the ceramic baked product was divided. Therefore, the notches 3 and 4 have no "burr", and thus a metrication error due to unstability in dividing the baked product is eliminated.

As is apparent from the front view (FIG. 2B) and the side view (FIG. 2C) in addition to the plan view (FIG. 2A), projecting portions are formed on the end faces in the notches 3 and 4. In these notches, the end faces of the second sheet as the member for patterning project slightly from the end faces of the other sheets toward the outside of the package. The end faces slightly projecting outward serve as reference end faces 5 and 6 when coming into contact with an external member. As in the embodiment shown in the figures, it is preferable that the reference end faces are formed of the sheet on which the conductor patterns are formed. It is preferred to adjust the shapes of the respective through holes shown in FIGS. 1A, 1B, and 1C considering the formation of the reference end faces in the notches.

At the long side ends of the package, notches with a semicircular shape observed when being seen from the upper surface side of the package and outer leads 7 are formed as in a conventional package. In order to secure spaces for forming the outer leads, it is preferable that the notches 3 and 4 used for the positioning of the package with respect to the external member are provided at the short side ends or corners of the package.

Next, a method of fixing the solid-state image element 1 to the package 2 is described with reference to FIG. 3.

The package 2 is positioned by being pressed against a positioning jig 51 that is provided with positioning projections 52, 53, and 54 and is placed in a predetermined location. As shown in FIG. 3, the package 2 is positioned with only the reference end faces 5 and 6 in the notches being in contact with the positioning jig 51. In other words, with respect to the horizontal direction (in the H direction in the figure), the reference end face 5 in the notch at the short side end is in contact with the projection 54 along its shape, and with respect to the vertical direction (in the V direction in the figure), the reference end faces 6 in the notches at the corners are in contact with the projections 52 and 53 along their shapes, thus adjusting the position of the package in the respective directions. The above description with reference to FIG. 3 was directed to the embodiment in which the package is positioned using the projections 52, 53, and 54. However, the method of positioning the package is not limited to this, and the package may be positioned using, for example, only two projections 53 and 54 (or projections 52 and 54). Preferably, both the respective projections and reference end faces have lengths allowing the package and the positioning jig to be positioned stably. It is preferable that in the package 2, the linear portions 5 and 6 parallel to the two adjacent side ends respectively (in other words, linear portions orthogonal to each other), which are observed when the package 2 is seen from the upper surface side, are formed in the notches 3 and 4.

Figure 3:
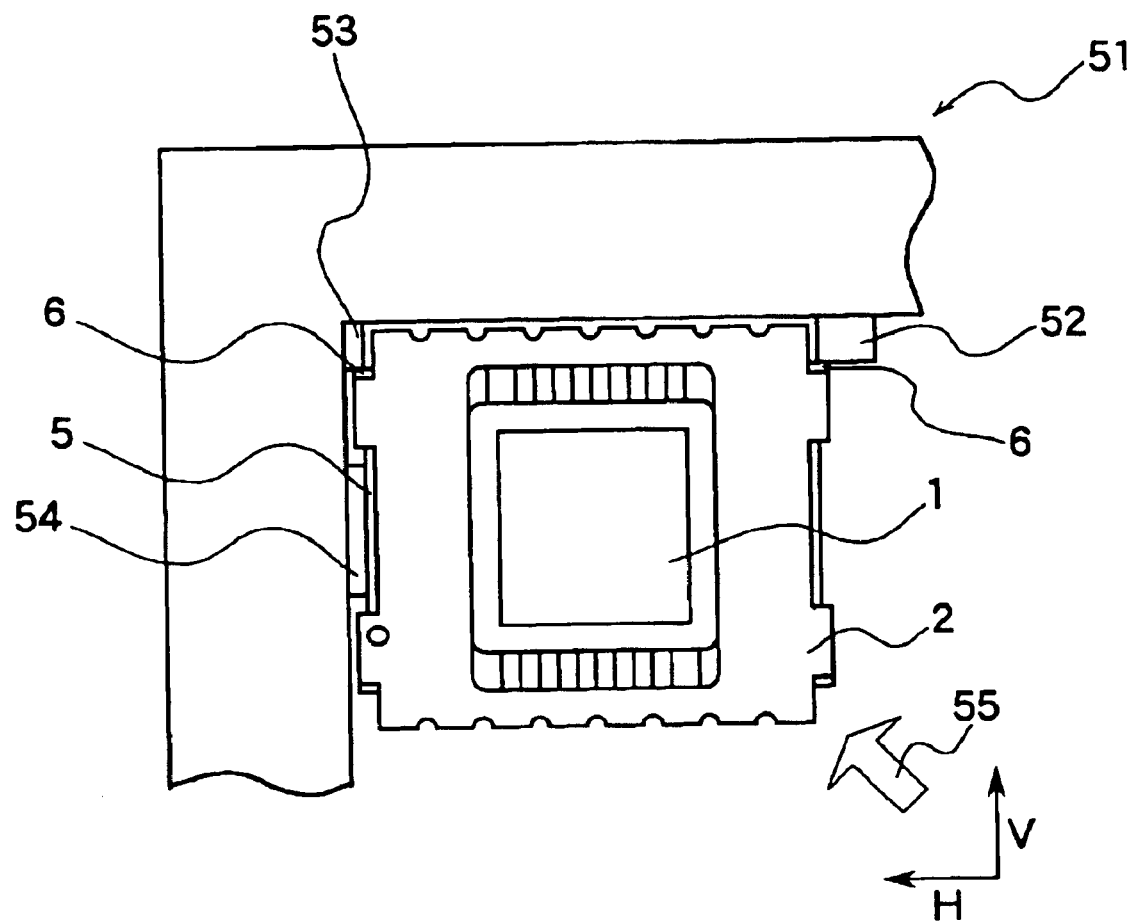
FIG. 3 is a plan view for explaining an embodiment of a method of positioning the package in the present invention.

In the embodiment of positioning the package shown in FIG. 3, the end faces other than those in the notches of the package are not in contact with the positioning jig. Therefore, even if a metrical error is caused by "burrs" at side ends other than those in the notches, positioning accuracy is not affected. Particularly, in the embodiment shown in the figure, the package is positioned while even in the notches, the end faces other than the reference end faces 5 and 6 formed of a predetermined sheet (the second sheet in this embodiment) are not in contact with the positioning jig.

Figure 4:
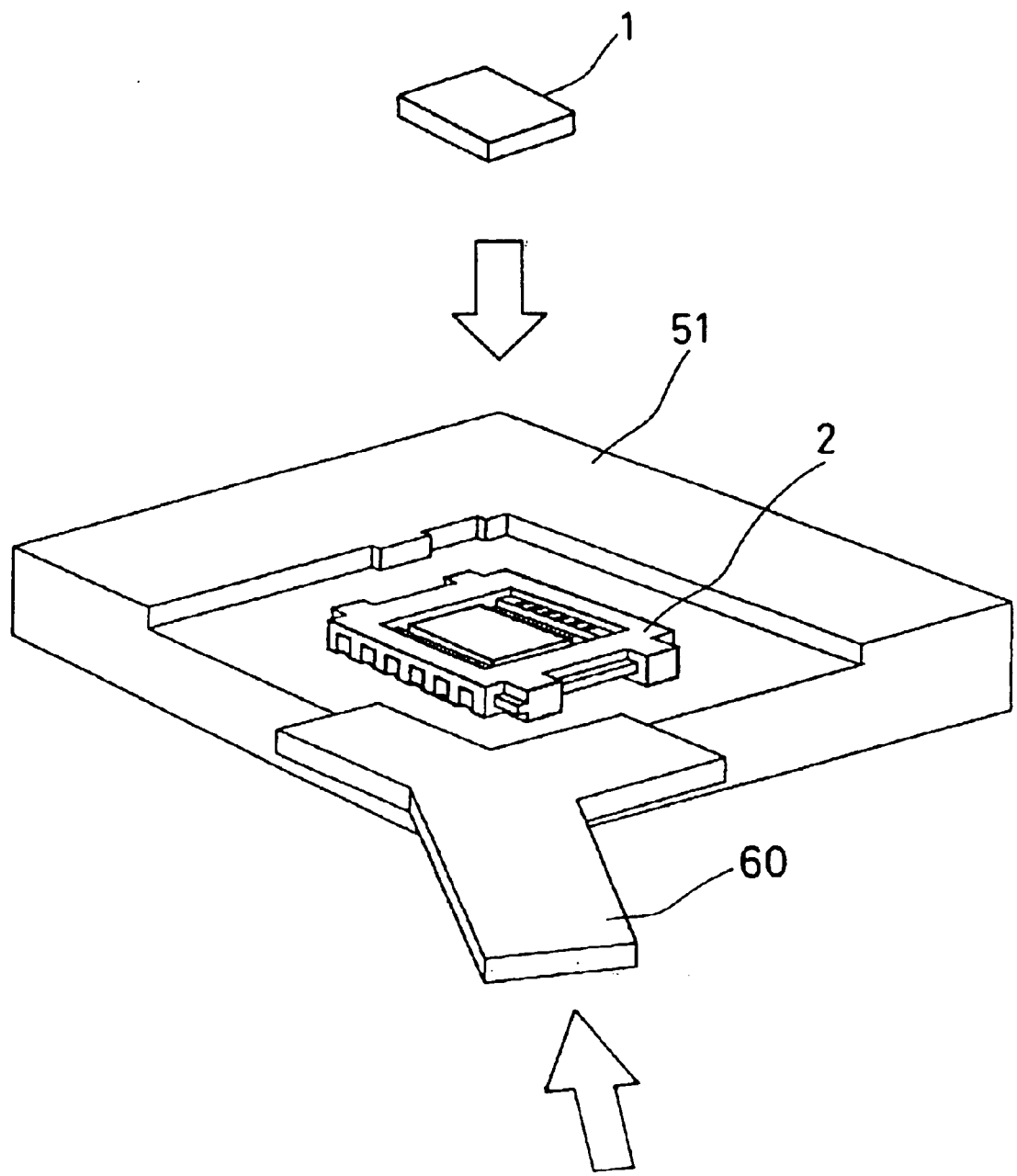
FIG. 4 is a perspective view for explaining the embodiment of a method of positioning the package in the present invention.

The positioning by the above-mentioned method is different from that using two pins positioned upright in a jig and can be carried out by a very simple movement of the package. The package is required only to be moved in the direction 55, allowing the package to move in both the directions H and V to be brought into contact with the positioning jig; As shown in FIG. 4, this positioning can be carried out by allowing the package to slide on a reference surface using a pressing member 60. The accurate positioning of the package by such a simple operation is highly advantageous for improving the accuracy and efficiency in mounting a solid-state image element.

As described above, at least two end faces observed as straight lines when being seen from the upper surface side are prepared in the notches of the package for a solid-state image device of the present invention. This package is positioned with at least its two faces being along the projections of the positioning jig and therefore the rotation movement of the package is prevented. Thus, the package is positioned accurately.

Preferably, the positioning jig is provided with projections that have linear portions coming into contact with the linear portions, which are observed when the package is seen from the upper surface side, of the notches along their shapes and project so that the side ends of the package other than those in the notches do not come into contact with the positioning jig. The number of the projections is not particularly limited. However, it is preferable that a projection is provided with at least two linear portions coming into contact with the notches of the package.

In addition, it is preferable that at least two contact faces between the package and the positioning jig are observed as linear portions substantially orthogonal to each other when being seen from the upper surface side of the package.

In the state where the package 2 thus has been positioned, the solid-state image element 1 is fixed to the concave portion on the upper surface of the package. Furthermore, predetermined steps are carried out, which include connecting inner leads (not shown in the figures) for connecting the solid-state image element 1 and the conductor pattern, sealing the element with a glass plate 8, and the like, thus manufacturing the solid-state image device shown in FIGS. 5A, 5B, and 5C.

Figure 6:
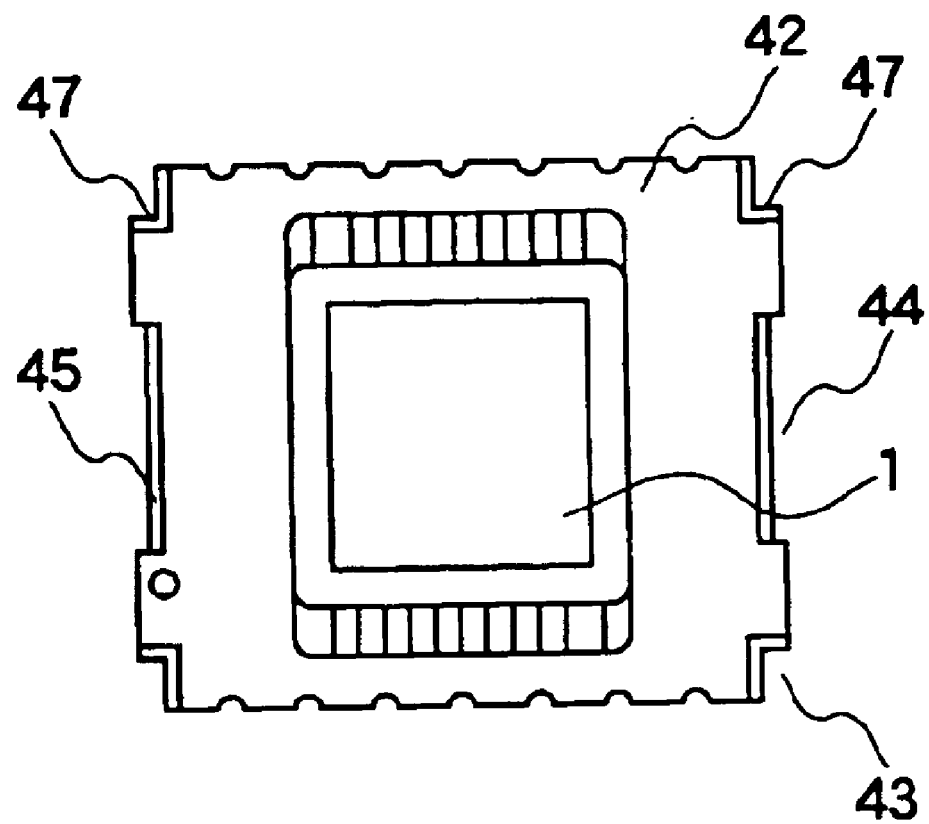
FIG. 6 is a plan view of another embodiment of the solid-state image device according to the present invention.
Figure 7:
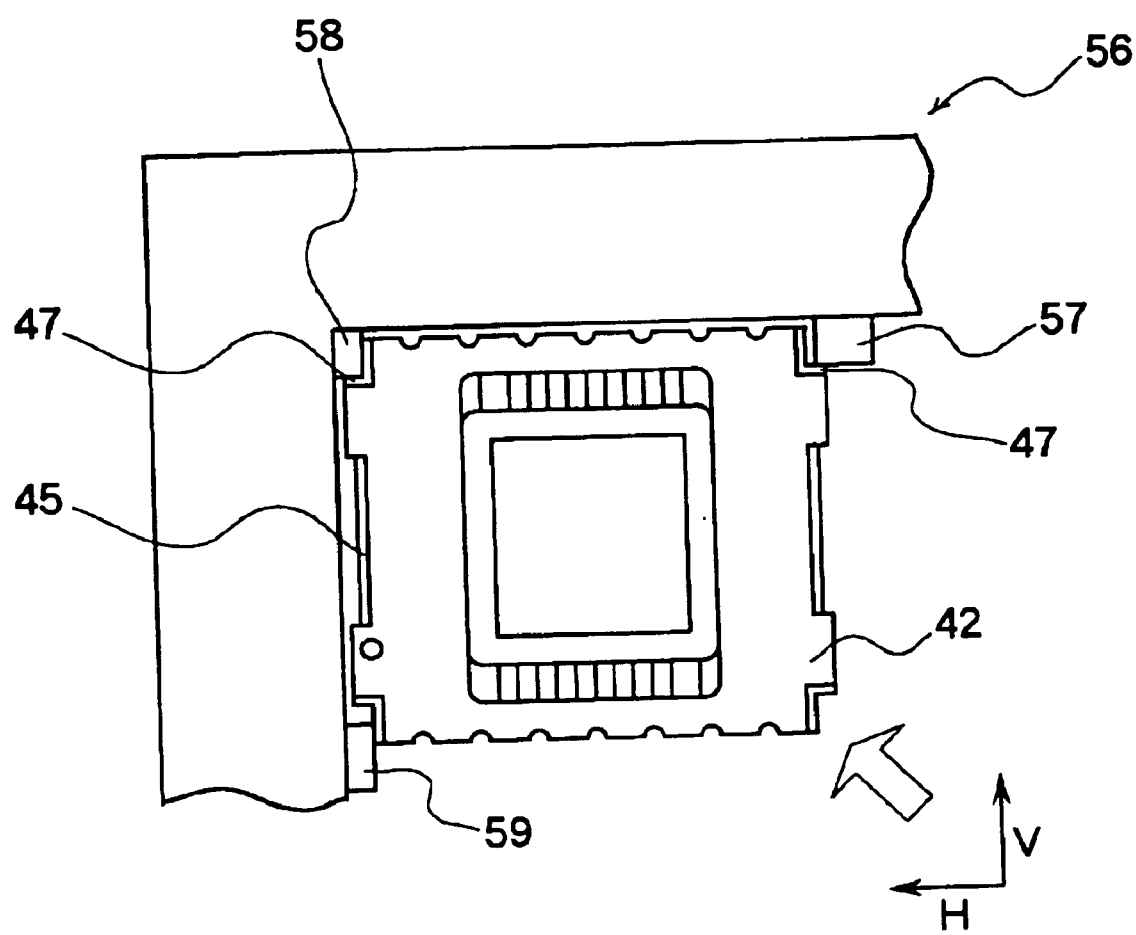
FIG. 7 is a plan view for explaining another embodiment of the method of positioning the package in the present invention.

The method of positioning the package in the solid-state image device according to the present invention is not limited to the above. For instance, as shown in FIGS. 6 and 7, reference end faces 47 having an "L" shape when being seen from the upper surface side are provided in the notches 43 at the corners, and a package 42 may be positioned by allowing the reference end faces 47 formed of two faces orthogonal to each other to position along the corner of a projection 58 of a positioning jig 56.

Similarly in this case, it is preferable that the package is positioned by an end face 45 and the end faces 47 in at least two notches 44 and 43 by also using the other projections 57 and 59 as shown in the figures. However, the package may be positioned with the reference end face 47 at the corner and the corresponding projection 58 alone. As described above, the present invention also includes the method of positioning a package using a notch at the corner alone.

Figure 8:
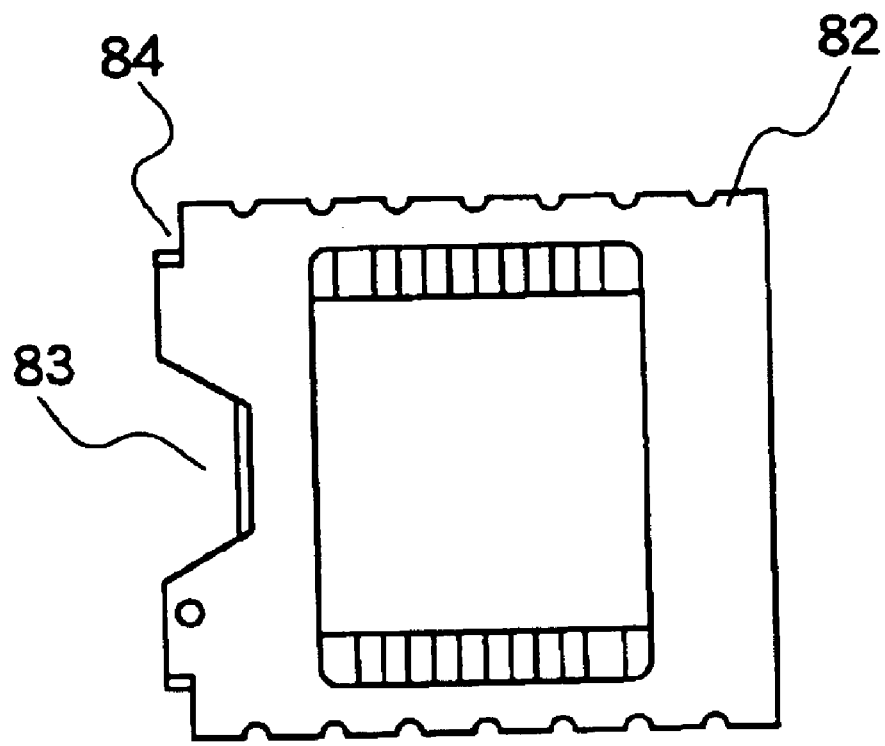
FIG. 8 is a plan view showing another embodiment of the package used for the solid-state image device of the present invention.

Furthermore, for example, as shown in FIG. 8, besides L-shaped notches 84 formed at corners, a notch 83 may be formed at a short side end by removing a region with a trapezoidal shape observed when being seen from the upper surface side of a package 82. This package 82 can be positioned using a positioning jig having projections coming into contact with both the notches 83 and 84. Thus, the present invention includes the method of positioning a package using at least two notches formed at least at one of the side ends adjacent to each other via a corner. The shape of the notches is not limited to a rectangle.

Figure 9A:
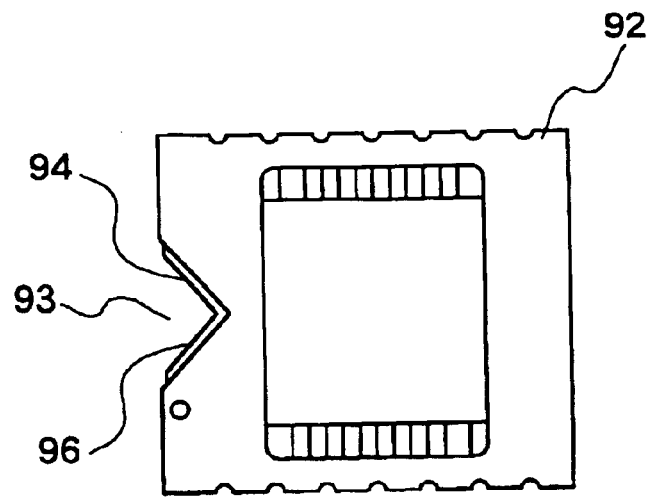
FIG. 9A is a plan view showing still another embodiment of the package used for the solid-state image device of the present invention and FIG. 9B is a plan view showing an example of a positioning form using this package.
Figure 9B:
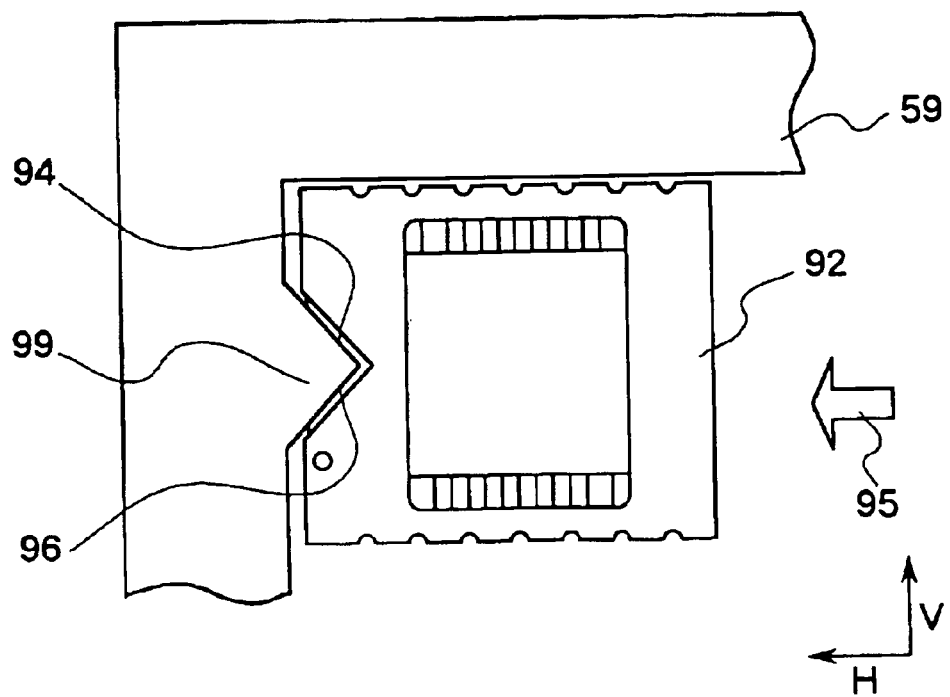
Figure 17A:
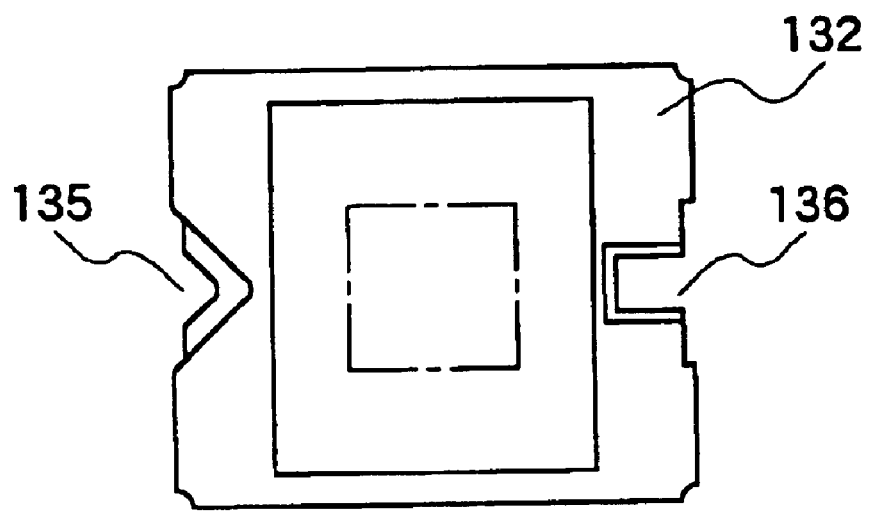
FIG. 17A is a plan view showing an example of a conventional solid-state image device.
Figure 17B:
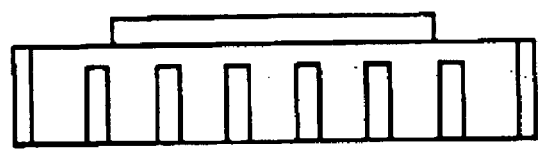
FIG. 17B is a front view of the same.
Figure 18:
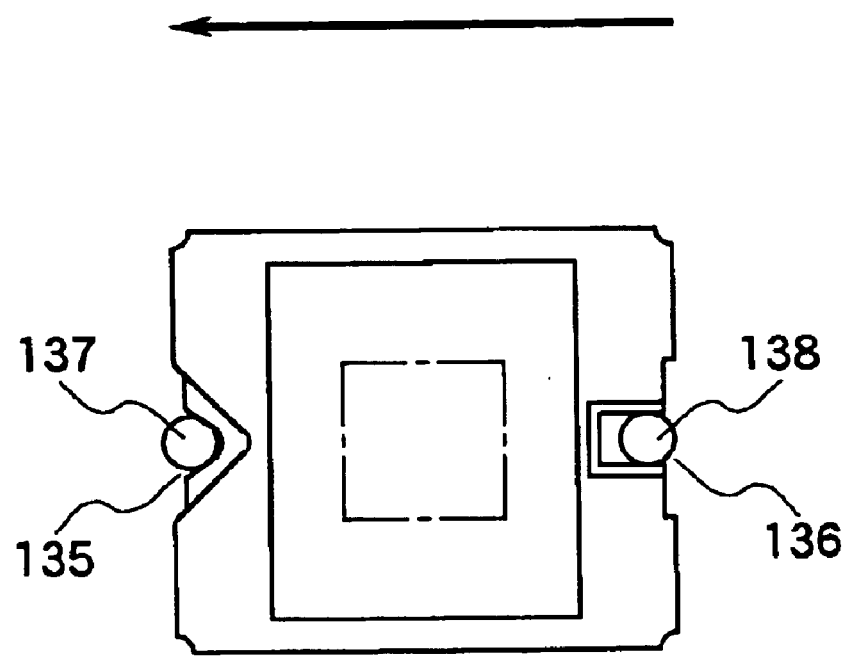
FIG. 18 is a plan view illustrating a positioning method using the solid-state image device shown in FIGS. 17A and 17B.

This package also may be positioned using one notch formed at a side end of the package. In this case, for example, as shown in FIG. 9A, a package 92 in which two reference end faces 94 and 96 are formed in a substantially V-shaped notch 93 formed at a short side end can be used. This package 92 can be positioned using a positioning jig 59 having a projection 99 coming into contact with the notch 93 along its shape (coming to fit into the notch 93) as shown in FIG. 9B. The formation of a notch with a "V" shape, which is observed when being seen from the upper surface side of a package, at a side end of the package also is disclosed in JP 10-326886 A, but this notch is used for inserting a pilot pin (FIG. 17). On the other hand, the positioning method shown in FIG. 9B is different from the positioning method using a pin and can be carried out by moving the package only in one direction (H direction) 95. The present invention also includes the positioning method using, as reference, at least two end faces formed in one notch at a side end.

Similarly in this method, as in the method using at least two notches formed at least at one of adjacent side ends, it is preferable that the contact portions between the notch and the projection of the positioning jig include a portion observed as a straight line when being seen from the upper surface side of the package.

However, the present invention is not limited to this when a package is positioned using at least two notches. For instance, the package may be positioned, as in the above, using a notch formed at a short side end to have a substantially semicircular shape when being seen from the upper surface side of the package and a notch formed at a corner to have a substantially one-fourth circular shape when being seen from the upper surface side and using a positioning jig provided with projections coming into contact with the notches along their shapes. As described above, in the positioning method according to the present invention, when at least two notches and projections of the positioning jig are brought into contact, the contact portions may have shapes not including a straight line observed when being seen from the upper surface side of the package. It is preferable that such contact portions are formed in arc shapes.

Figure 10:
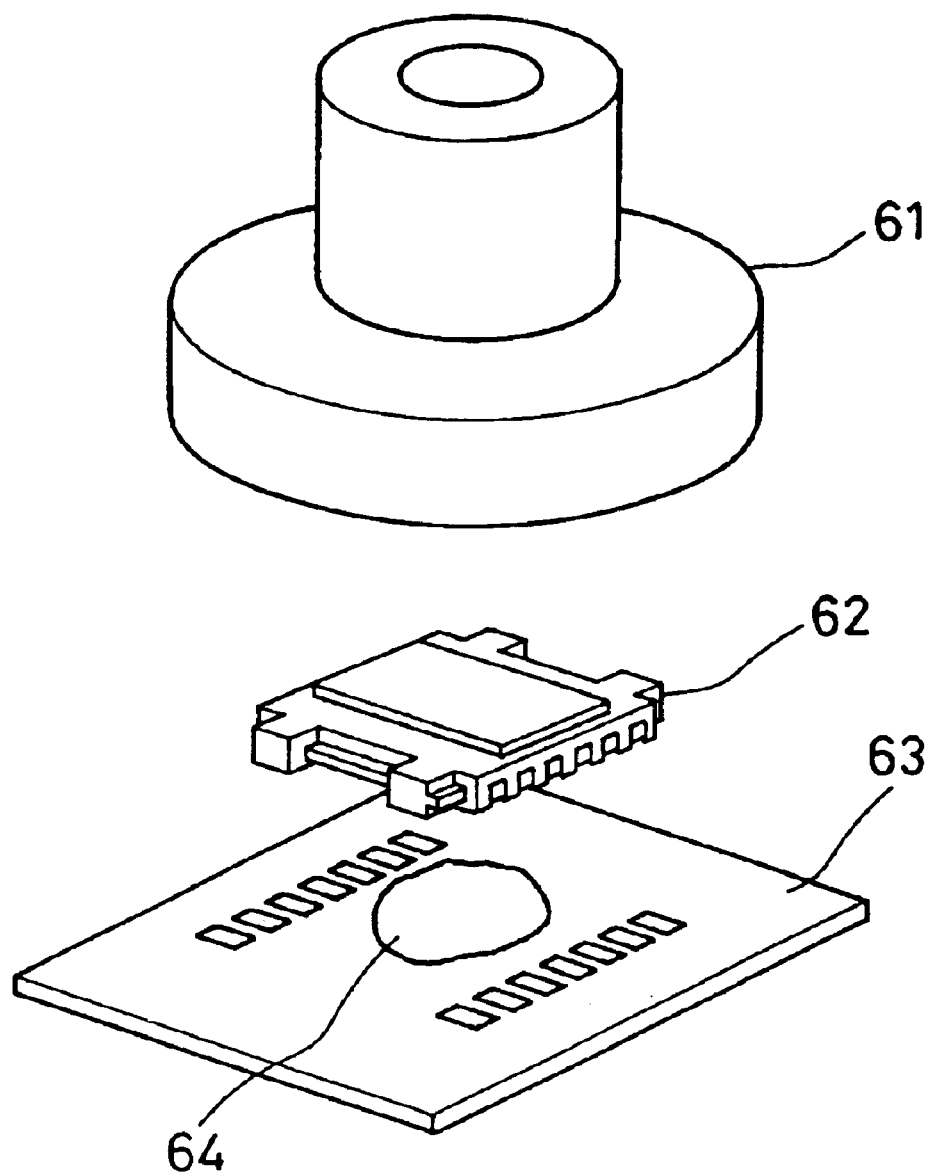
FIG. 10 is a perspective view showing a structural example of a camera using a solid-state image device of the present invention.

As shown in FIG. 10, a solid-state image device 62 is positioned with respect to a lens block 61 and is fixed onto a wiring board 63 with an adhesive 64 or the like, which thus is used as a camera. A preferable method of positioning the solid-state image device and the lens block is described as follows.

Figure 11:
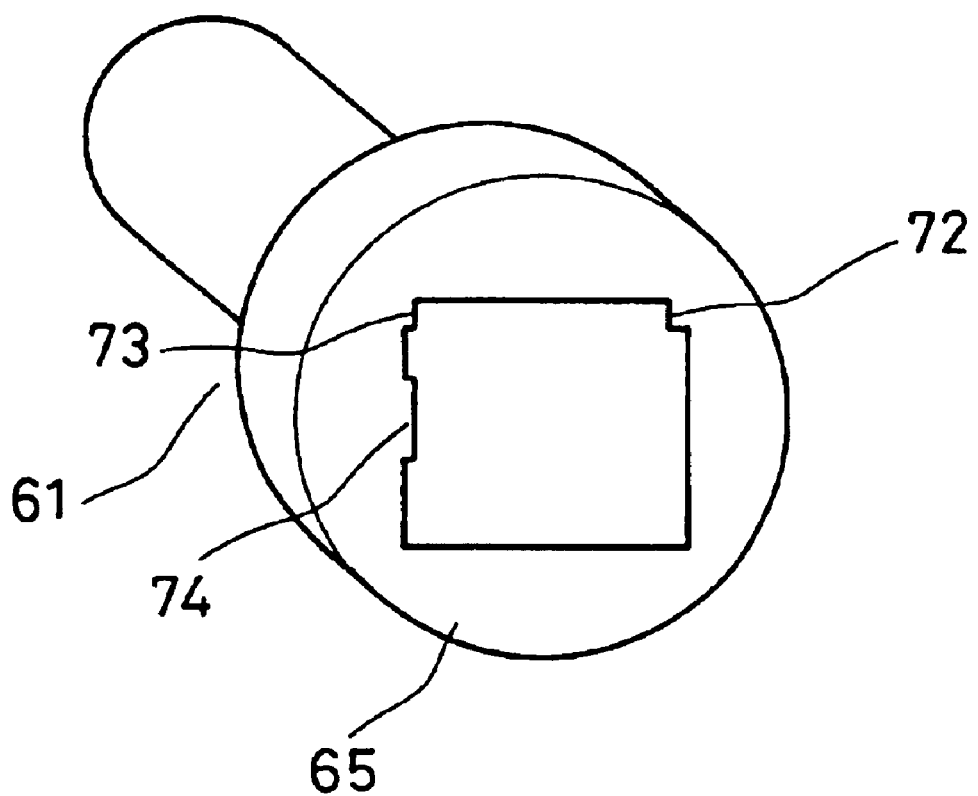
FIG. 11 is a perspective view showing an example of a lens block used for the camera of the present invention.

The lens block and the solid-state image device can be positioned using notches of a package. In this method, as shown in FIG. 11, it is preferred to form projections 72, 73, and 74 on a surface 65, which is fixed to the solid-state image device, of the lens block 61. The arrangement and shapes of the projections can be determined according to the notches of the package as in the positioning jig used for fixing a solid-state image element.

Figure 12:
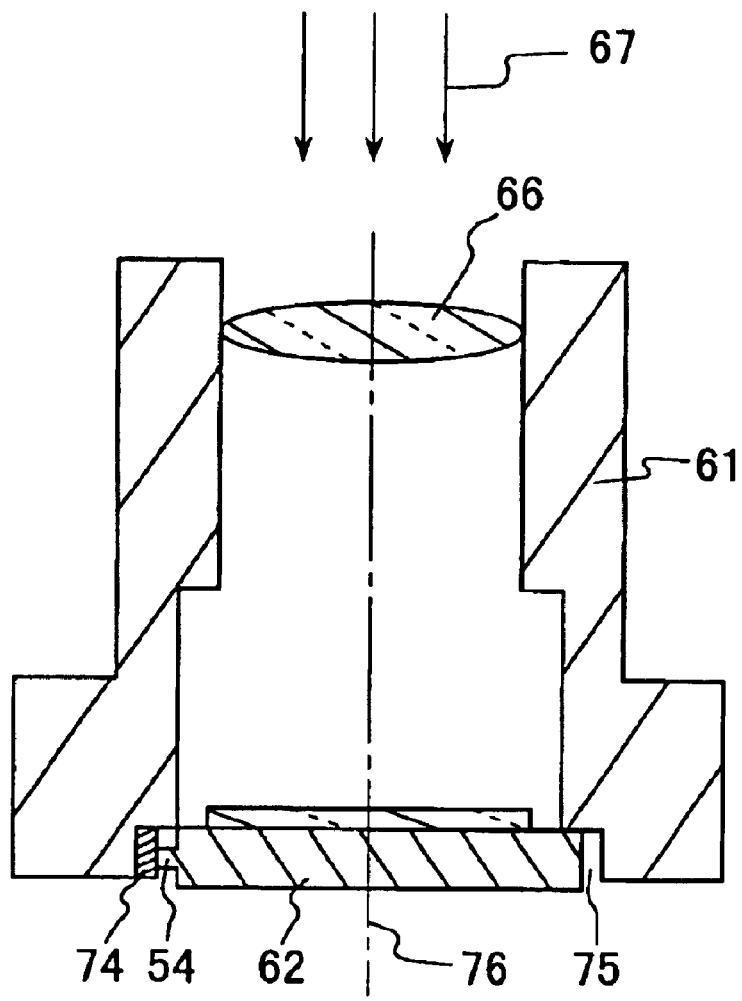
FIG. 12 is a sectional view of an embodiment of the camera using the solid-state image device of the present invention.
Figure 13:
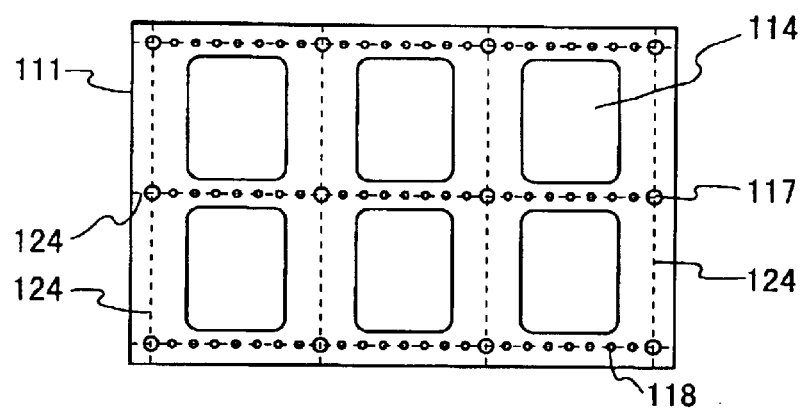
Figure 13:
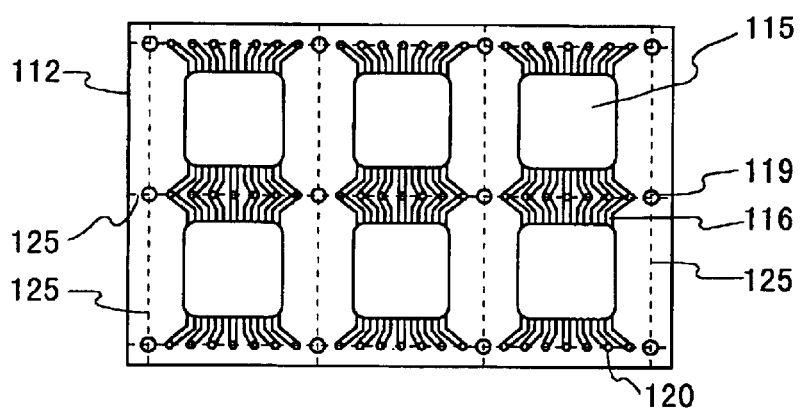
Figure 13:
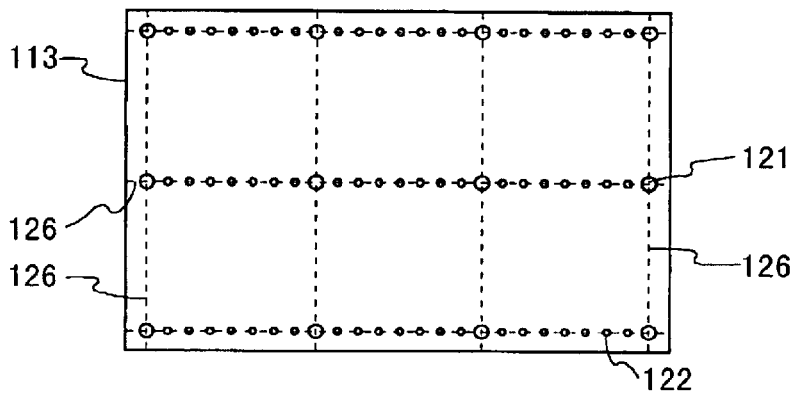

The positioning method of the package is the same as that described in the above except for the use of the lens block instead of the positioning jig. In this way, for example as shown in FIG.12, the projection 74 of the lens block 61 comes into contact with a reference end face 54 along its shape in a notch of the solid-state image device 62 and similarly, the other notches and the projections 72 and 73 come into contact with each other. Thus, the lens block 61 and the solid-state image device 62 are positioned. Similarly in this case, even if projections have been produced due to burrs at side ends of the package, the deterioration in positioning accuracy can be prevented by a clearance 75 between the lens block and the solid-state image device.

As described above, when a solid-state image element is fixed to a package accurately and this package and a lens block are fixed accurately to each other, the misalignment between an optical axis 76 of a lens 66 gathering external light 67 and a design optical axis of the solid-state image element can be prevented.

The method of positioning the lens block and the solid-state image device is not limited to the above-mentioned method. All the methods described above as positioning methods of a package can be applied to the method of positioning the lens block and the solid-state image device. The lens block and the solid-state image device may be fixed after the lens block is positioned with respect to a positioning jig used for positioning a package. In addition, the lens block may be positioned with respect to another member (for example, a wiring board) that has been positioned together with the package using a positioning jig. The shapes of the packages used for the solid-state image devices of the present invention also can be applied to optical components such as a photoreceptor and a light-emitting device.

As described above, the present invention can provide a solid-state image device using a package in which a solid-state image element can be positioned accurately even when the size of the solid-state image device is reduced. In addition, the present invention can provide a camera using the solid-state image device in which the solid-state image device and a lens block are positioned accurately and thus the deterioration in characteristics such as shading is suppressed.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state image device, comprising a solid-state image element and a package that is formed by laminating at least two ceramic sheets and has a retangular outer shape when being seen from an upper surface side of the package, the package including a member for patterning, on a surface of which a conductor pattern for transmitting signals from the solid-state image element is formed, wherein the package has first side ends at which no outer lead is formed and second side ends at which outer leads are formed, at least one corner of the package has a recessed portion having an "L" shape when being seen from the upper surface side, and each of the first side ends of the package has a recessed portion having a "U" shape when being seen from the upper surface side, the recessed portion having an "L" shape and the recessed portion having a "U" shape are defined respectively by end faces including reference and faces having a linear shape when being seen from the upper surface side, and the reference end face in the recessed portion having an "L" shape is parallel to the second side ends, the reference end face in the recessed portion having a "U" shape is parallel to the first side ends.

2. The solid-state image device according to claim 1, wherein the reference end faces are formed of the member for patterning.

3. A camera comprising:

a solid-state image device according to claim 2; and a lens block that has projections coming into contact respectively with the reference end face in the recessed portion having an "L" shape and the reference end face in the recessed portion having a "U" shape along their shapes and a lens focusing external light onto the solid-state image element included in the solid-state image device, wherein the solid-state image device and the lens block are positioned with the projections being in contact with the reference end faces along their shapes.

4. A camera comprising:

a solid-state image device according to claim 1; and a lens block that has projections coming into contact respectively with the reference end face in the recessed portion having an "L" shape and the reference end face in the recessed portion having a "U" shape along their shapes and a lens focusing external light onto the solid-state image element included in the solid-state image device, wherein the solid-state image device and the lens block are positioned with the projections being in contact with the reference end faces along their shapes.

* * * * *